(12) United States Patent
Oja et al.

(10) Patent No.: US 10,807,861 B2
(45) Date of Patent: Oct. 20, 2020

(54) SURFACE MICROMECHANICAL ELEMENT AND METHOD FOR MANUFACTURING THE SAME

(71) Applicant: Teknologian tutkimuskeskus VTT Oy, Espoo (FI)

(72) Inventors: Aarne Oja, Espoo (FI); Jaakko Saarilahti, Espoo (FI)

(73) Assignee: Teknologian tutkimuskeskus VTT Oy, Espoo (FI)

(*) Notice: Subject to any disclaimer, the term of this patent is extended or adjusted under 35 U.S.C. 154(b) by 0 days.

(21) Appl. No.: 16/096,735

(22) PCT Filed: May 2, 2017

(86) PCT No.: PCT/FI2017/050337
§ 371 (c)(1),
(2) Date: Oct. 26, 2018

(87) PCT Pub. No.: WO2017/191365
PCT Pub. Date: Nov. 9, 2017

(65) Prior Publication Data
US 2019/0119102 A1    Apr. 25, 2019

(30) Foreign Application Priority Data

May 2, 2016    (FI) .................................. 20165375

(51) Int. Cl.
*B81B 7/00* (2006.01)
*B81C 1/00* (2006.01)
*G01L 9/00* (2006.01)

(52) U.S. Cl.
CPC ........ *B81B 7/0048* (2013.01); *B81C 1/00325* (2013.01); *G01L 9/0072* (2013.01);
(Continued)

(58) Field of Classification Search
None
See application file for complete search history.

(56) References Cited

U.S. PATENT DOCUMENTS

2002/0185715 A1* 12/2002 Honer ................. H01L 21/50
257/669
2003/0005774 A1* 1/2003 Suzuki ................. G01L 9/0073
73/724

(Continued)

FOREIGN PATENT DOCUMENTS

DE    4111119 A1    10/1992
DE    4441903 C1    3/1996
(Continued)

OTHER PUBLICATIONS

Fisher et al: Integrating MEMS and ICs. Microsystems & Nanoengineering, vol. 1, No. 15005, May 28, 2015, pp. 1-15.

Primary Examiner — Michelle Mandala
Assistant Examiner — Jordan M Klein
(74) Attorney, Agent, or Firm — Laine IP Oy

(57) ABSTRACT

The present publication discloses a micromechanical structure including at least one active element, the micromechanical structure comprising a substrate, at least one layer formed on the substrate forming the at least part of the at least one active element, mechanical contact areas through which the micromechanical structure can be connected to other structures like printed circuit boards and like. In accordance with the invention the micromechanical structure includes weakenings like trenches around the mechanical contact areas for eliminating the thermal mismatch between the active element of the micromechanical structure and the other structures.

12 Claims, 15 Drawing Sheets

(52) U.S. Cl.
CPC ......... *B81B 2201/0264* (2013.01); *B81B 2201/0271* (2013.01); *B81B 2203/0127* (2013.01); *B81B 2203/04* (2013.01); *B81C 2201/0132* (2013.01)

(56) References Cited

U.S. PATENT DOCUMENTS

| | | | |
|---|---|---|---|
| 2003/0015040 | A1 | 1/2003 | Ishio et al. |
| 2007/0206367 | A1* | 9/2007 | Yasukawa ............. B81B 7/0048 361/784 |
| 2007/0287215 | A1 | 12/2007 | Utsumi et al. |
| 2009/0320606 | A1 | 12/2009 | Carlen et al. |
| 2010/0096714 | A1 | 4/2010 | Nakatani |
| 2012/0032283 | A1 | 2/2012 | Frey et al. |
| 2012/0037412 | A1 | 2/2012 | Reinmuth |
| 2012/0264250 | A1* | 10/2012 | Graham ................ B81B 3/0072 438/53 |
| 2013/0207208 | A1* | 8/2013 | Graham ................ G01L 9/0073 257/419 |
| 2013/0233086 | A1 | 9/2013 | Besling et al. |
| 2014/0217521 | A1* | 8/2014 | Johari-Galle ....... B81C 1/00134 257/415 |
| 2016/0090297 | A1* | 3/2016 | Zhang ................... B81B 7/0048 257/417 |
| 2017/0073218 | A1* | 3/2017 | Kaanta .................. B81B 7/0048 |

FOREIGN PATENT DOCUMENTS

| | | |
|---|---|---|
| DE | 102009000056 A1 | 7/2010 |
| DE | 102014224063 B3 | 3/2016 |
| EP | 0430676 A2 | 6/1991 |
| GB | 2436460 A | 9/2007 |
| WO | WO2004063089 A2 | 7/2004 |
| WO | WO2012037536 A2 | 3/2012 |

* cited by examiner

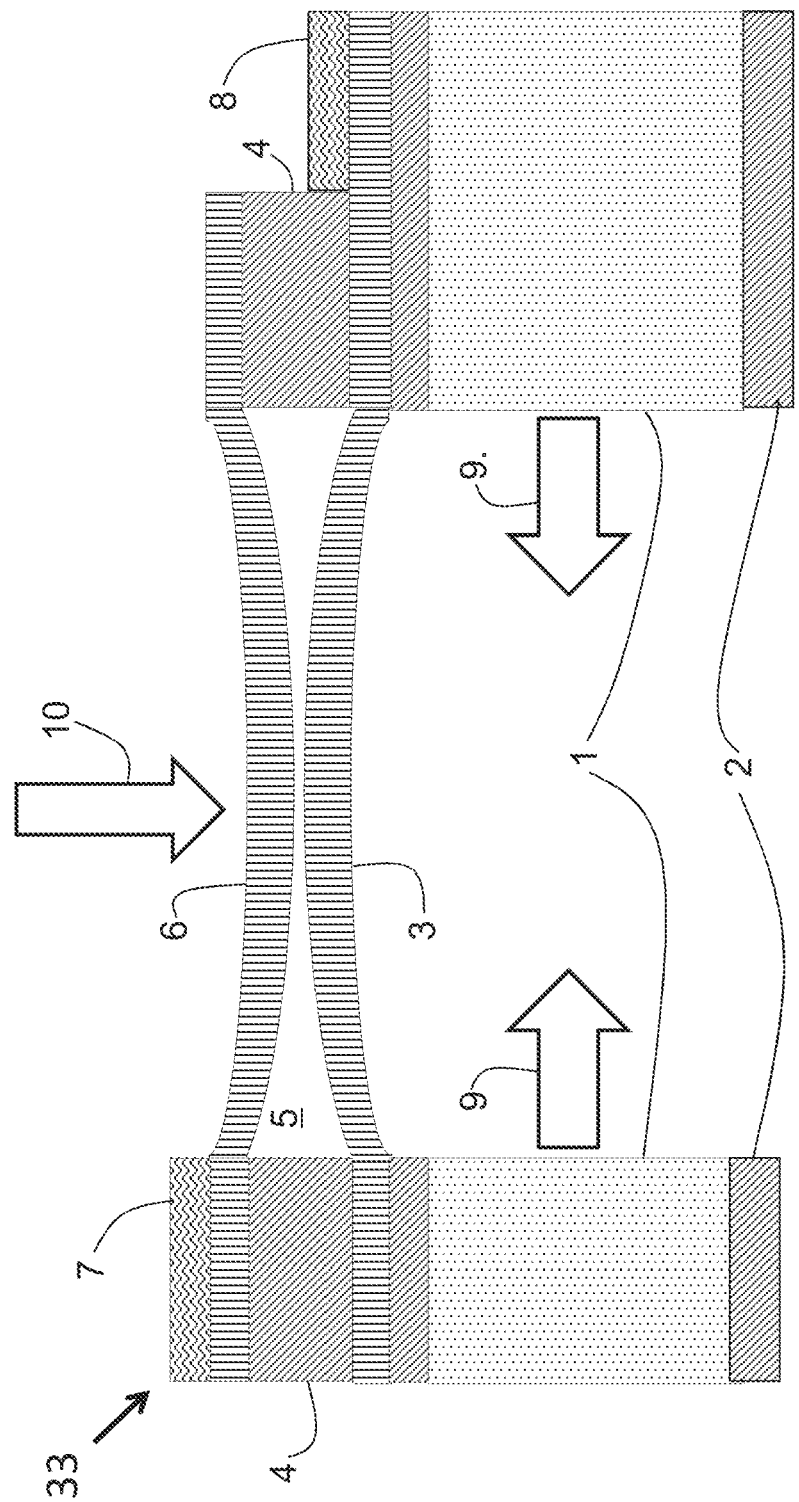

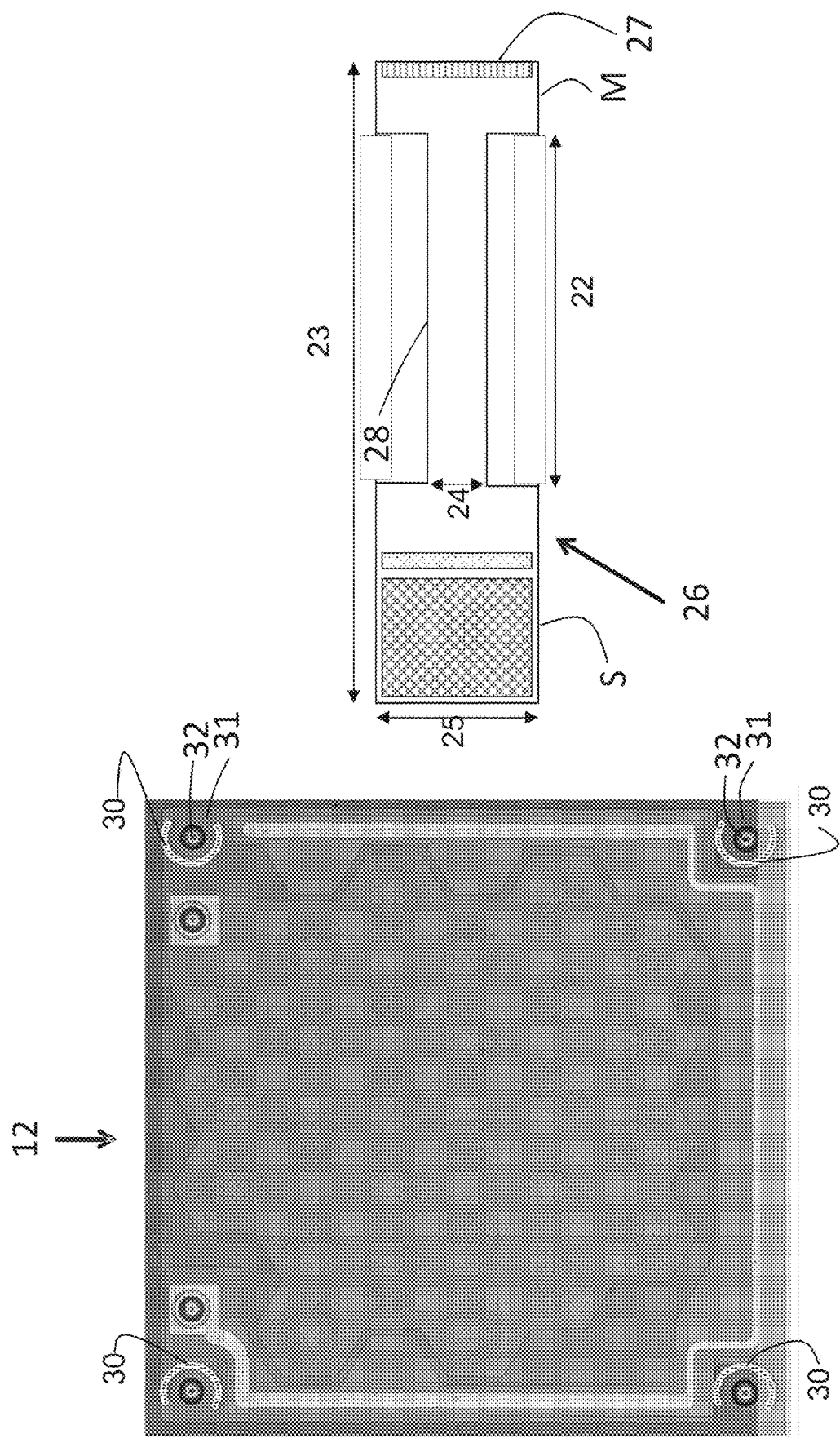

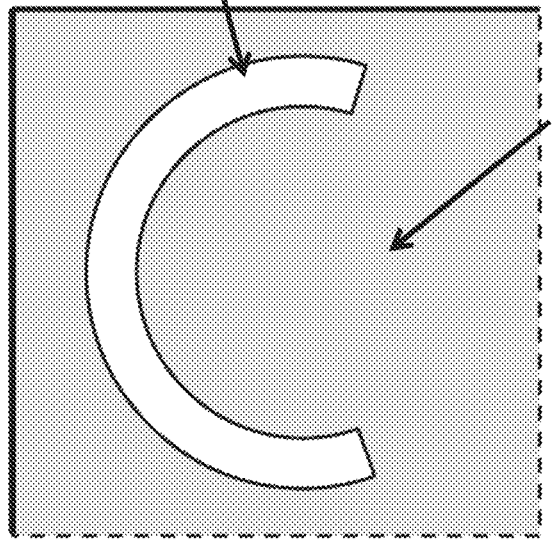
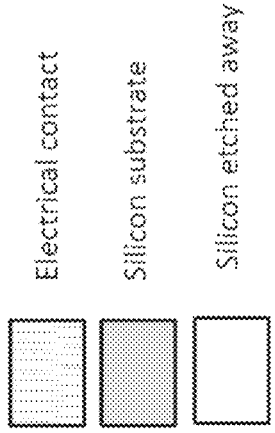
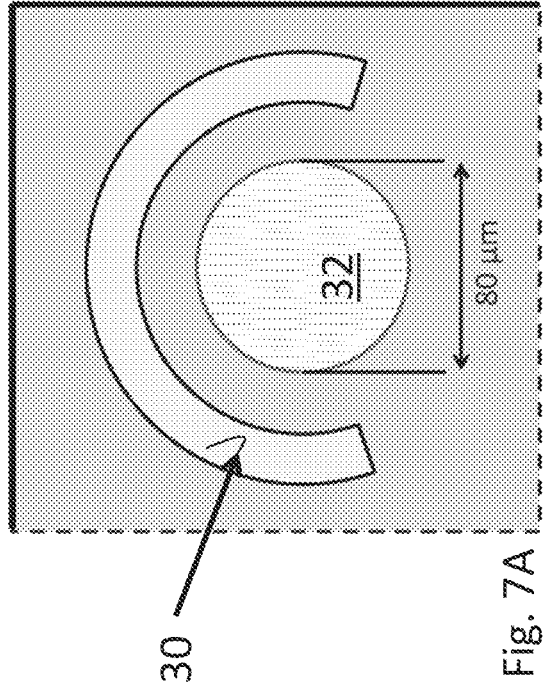
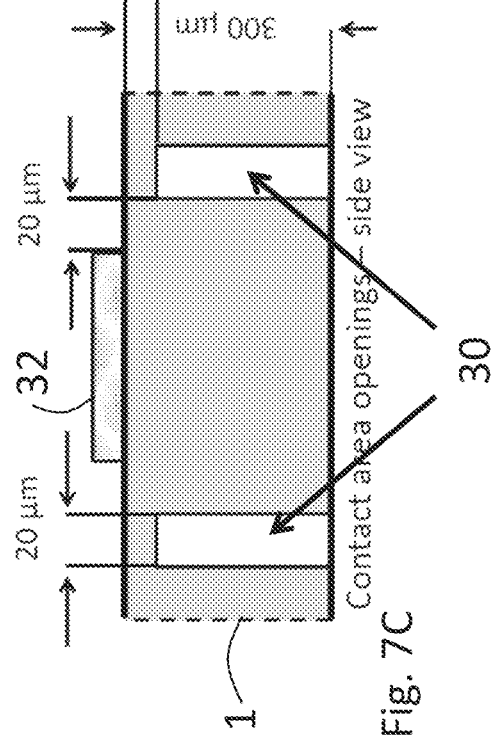
Fig. 7A   Fig. 7B   Fig. 7C

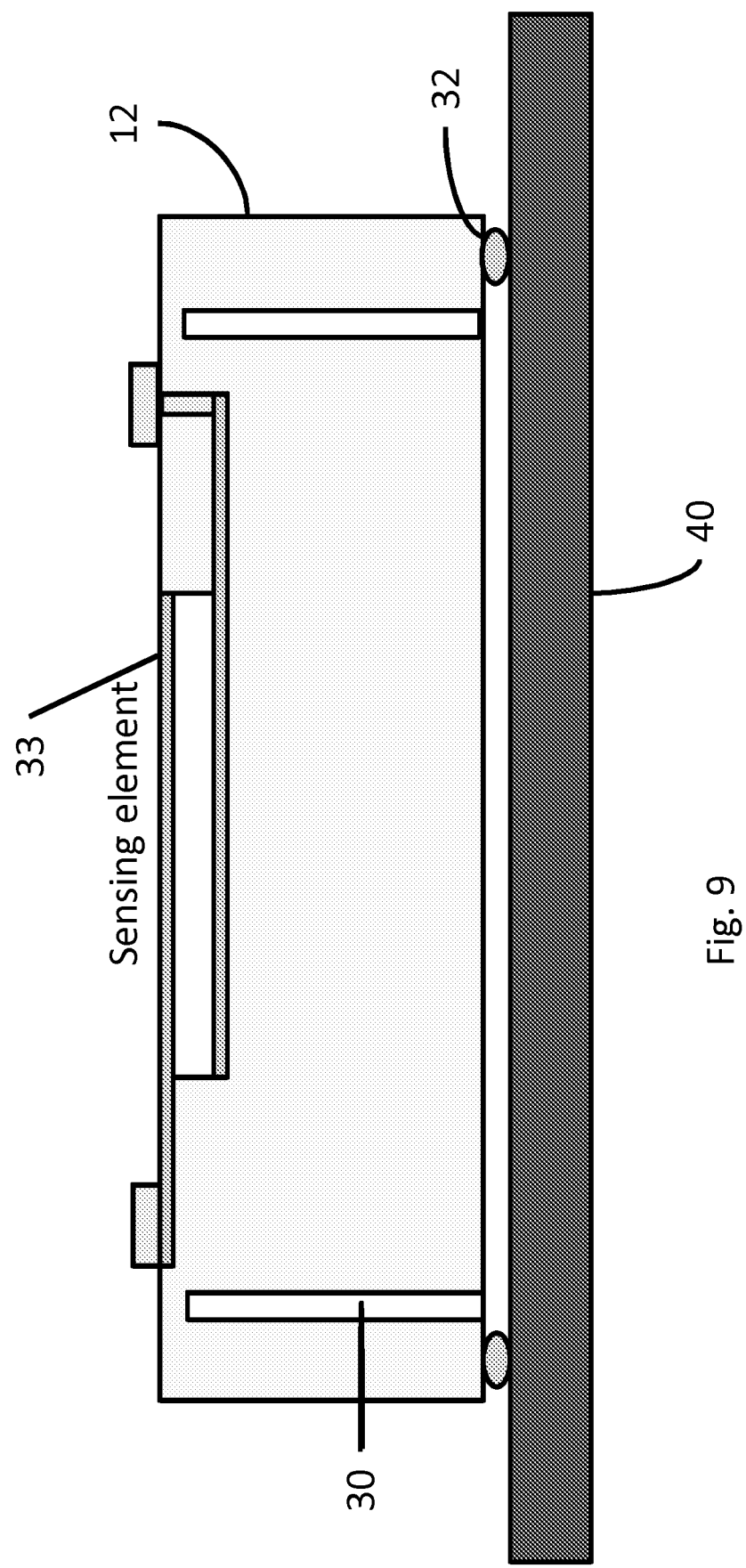

SURFACE MICROMECHANICAL ELEMENT AND METHOD FOR MANUFACTURING THE SAME

BACKGROUND

The invention relates to a micromechanical element according to the preamble of claim 1 and a method for manufacturing the same.

Traditionally, micromechanical pressure sensors are categorized in two classes according to their manufacturing method. A pressure sensor is categorized as a surface micromechanical sensor if it is manufactured using surface micromechanical techniques, while the term bulk micromechanical device is used if the fabrication of the sensor is based on the older bulk micromechanical technique.

On the basis of their constructional differences, pressure sensors are also categorized in two classes depending on whether the sensor is responsive to a differential pressure or an absolute pressure.

Prior-art sensor structures are described, e.g., in publication EP01982512, where a method for using a porous polycrystalline silicon layer as a portion of the flexible diaphragm of the sensor structure is used. Basically a typical pressure sensor comprises a top electrode, bottom electrode and a cavity between them. The pressure is detected in the change of capacitance between the top and bottom electrodes caused by bending of at least one of the electrodes.

In the prior art there are however some drawbacks. The main sources for inaccuracies and mounting problems with encapsulated surface micromachined sensors are mechanical forces caused by mounting or external temperature changes.

The present patent application discloses a novel construction for a surface micromechanical pressure sensor and a method for manufacturing the same.

SUMMARY OF THE INVENTION

The invention is based on that the micromechanical structure includes weakenings like trenches around the mechanical contact areas for eliminating the thermal mismatch between the active element of the micromechanical structure and the other structures.

In another embodiment of the invention string structures are formed for eliminating thermal mismatches between a PCB-board and the sensor.

In another embodiment of the invention the sensor chip is formed as an elongated structure such that the actual sensing end of this structure is not attached to the frame of the sensor.

In another embodiment of the invention it is based on creating a floating bottom electrode for eliminating the mechanical stresses inside the MEMS chip and between the joint of the chip and PCB-board. In one preferred embodiment the back electrode is used as a second sensing electrode.

More specifically, the micromechanical structure according to the invention is characterized by what is stated in the characterizing part of claim 1.

Furthermore, the method according to the invention is characterized by what is stated in the characterizing part of claim 11.

The invention offers significant benefits.

The invention makes it possible decrease mechanical stresses both inside the micromechanical structure and between the micromechanical structure and the frame to which the sensor structure is mounted, e.g. PCB board.

In the following, the invention will be examined in greater detail with the help of exemplifying embodiments illustrated in the appended drawings in which FIG. 1 shows a typical design of a conventional surface micromechanical MEMS pressure sensor element as a cross section.

FIG. 4 shows cross section of the back-opened pressure sensor element with bending back electrode in accordance with the invention.

FIG. 5 shows a sensor structure layout for direct assembling on PCB using stress eliminating springs in accordance with the invention.

FIG. 6 shows a sensor structure layout for on PCB using stress eliminating aspect ration in accordance with the invention.

FIGS. 7A-7C show details of the FIG. 5.

FIG. 9 shows as a cross sectioned side view one embodiment of the invention.

Figure 1:
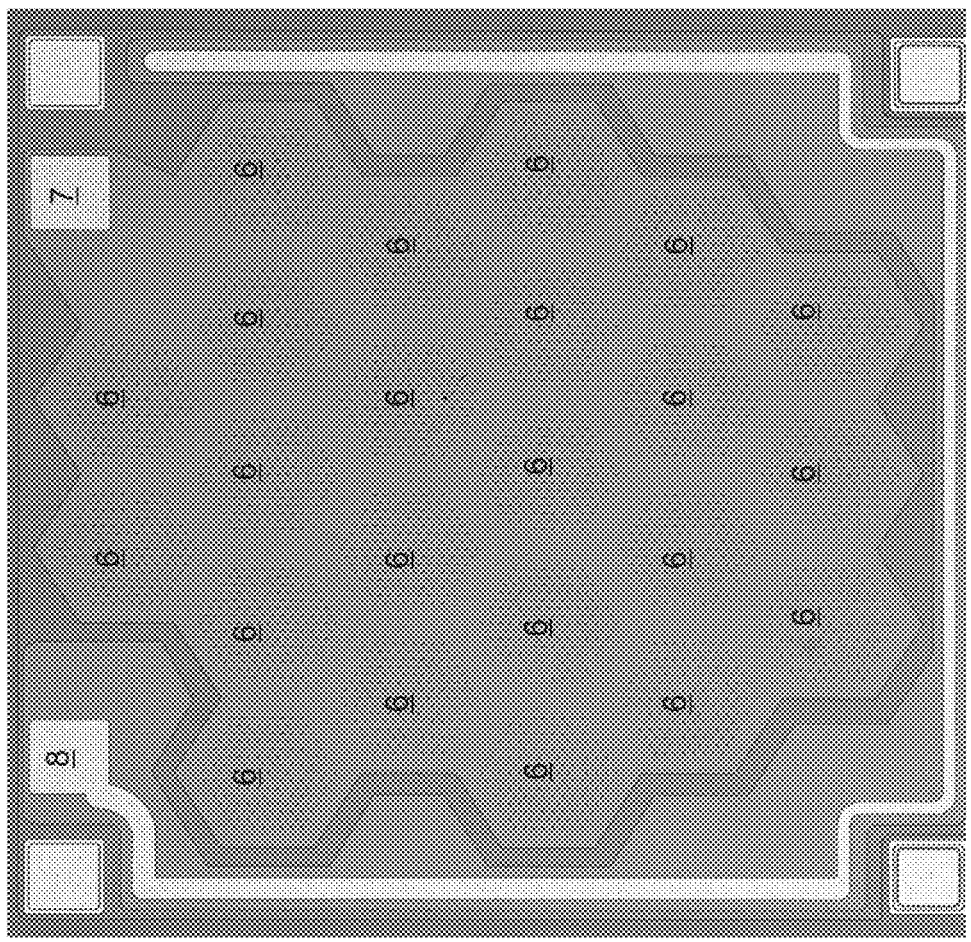

TERM LIST 1 substrate, e.g Si substrate
2 Bottom insulator (e.g. Silicon oxide)
3 Bottom electrode (e.g. Polysilicon or metal)
4 Sacrificial oxide (e.g. Silicon oxide)
5 first cavity, vacuum cavity
6 Bending upper electrode (or op electrode, e.g. Poly-Si, $Si_3N_4$, ALD thin film or combination)
7 Top contact pad (e.g. aluminum)
8 Bottom contact pad (e.g. aluminum)
9 Forces from thermal mismatch of the sensor mounting
10 External pressure, e.g. air pressure
11 Second cavity
12 Sensor structure, micromechanical structure, MEMS element
23 Length of the sensor chip
22 Length of the passive silicon part of the sensor chip
26 Sensor chip
27 Electrical contacts of the sensor chip
28 Passive silicon part of the sensor chip
30 Trench, weakening
31 String
32 Mechanical connection point 33 Sensor element, active element
34 pressure port
40 circuit board, casing, substrate, other structure
S First end of the sensor chip
M Second end of the sensor chip The invention relates to methods for compensating the temperature dependences and enhancing sensitivity and installing of pressure sensors made with MEMS technology. The main sources for inaccuracies and mounting problems with encapsulated surface micromachined sensors are mechanical forces caused by mounting or external temperature changes.

Typically the pressure sensor element 33 comprises a top electrode 6, bottom electrode 3 and a cavity 5 between them and the pressure is detected in the change of capacitance between the top 6 and bottom electrodes 3 caused by bending of at least one of the electrodes.

Figure 2:
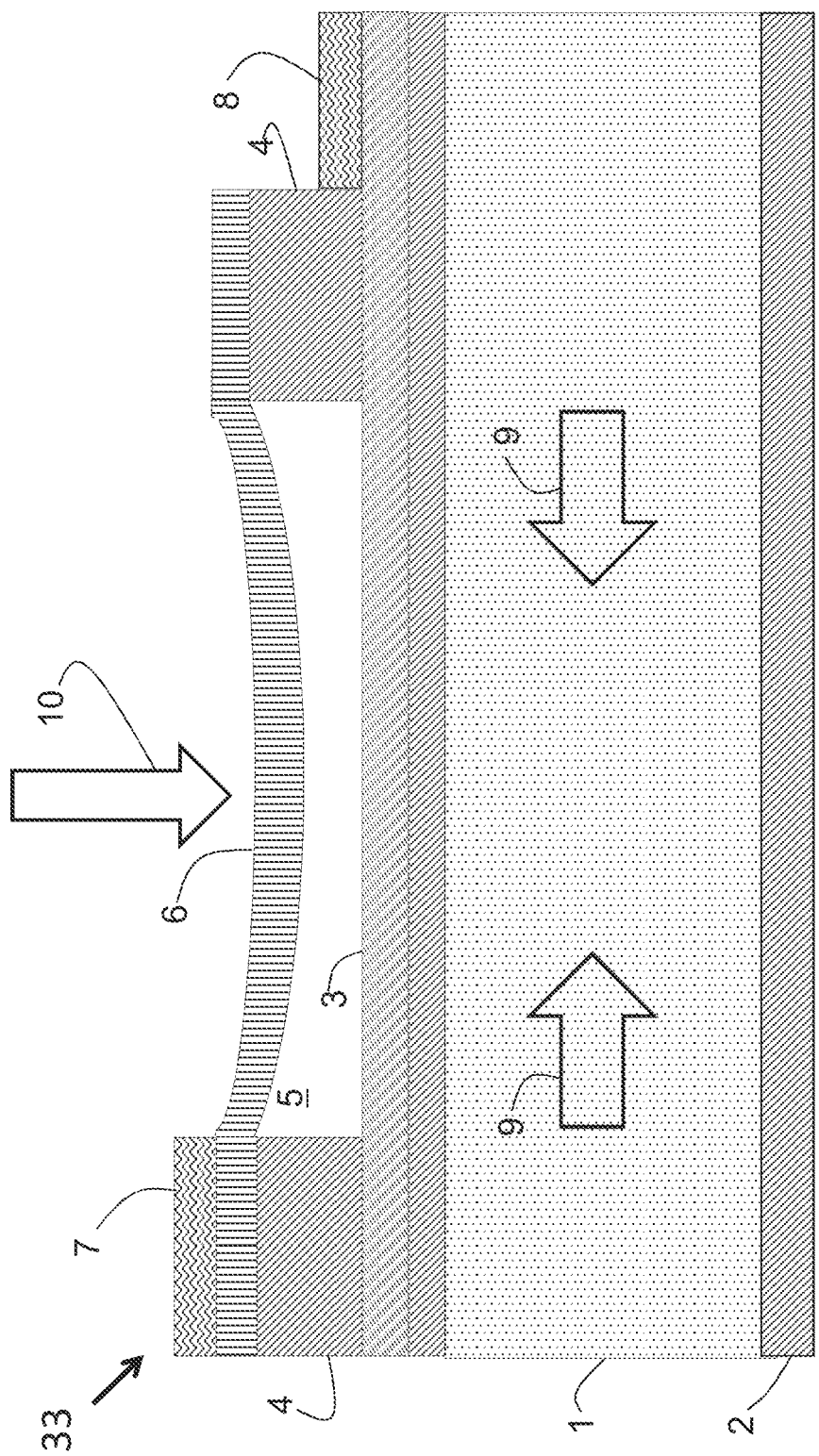
FIG. 2 shows a cross section of a conventional surface micromechanical MEMS pressure sensor element.

With reference to FIGS. 1 and 2 the typical dimensions suitable for the invention are the following:

The chip size is typically 0.5 mm$^2$-4.0 mm$^2$

The thickness of the sensor chip is defined by the silicon substrate, which could be thinned down to less than 100 μm. The thickness of the active sensor structure is less than 5 μm.

The pressure sensor structure 12 is constructed of an array of surface micromechanical, capacitive pressure sensor elements 33

The diameter of each element 33 is about 10-500 μm depending on the top membrane material, the mechanical stress of the top membrane, the size of the sensor gap and the measured pressure range.

the sensor may include an internal oxide reference capacitor for temperature compensation.

Figure 3:
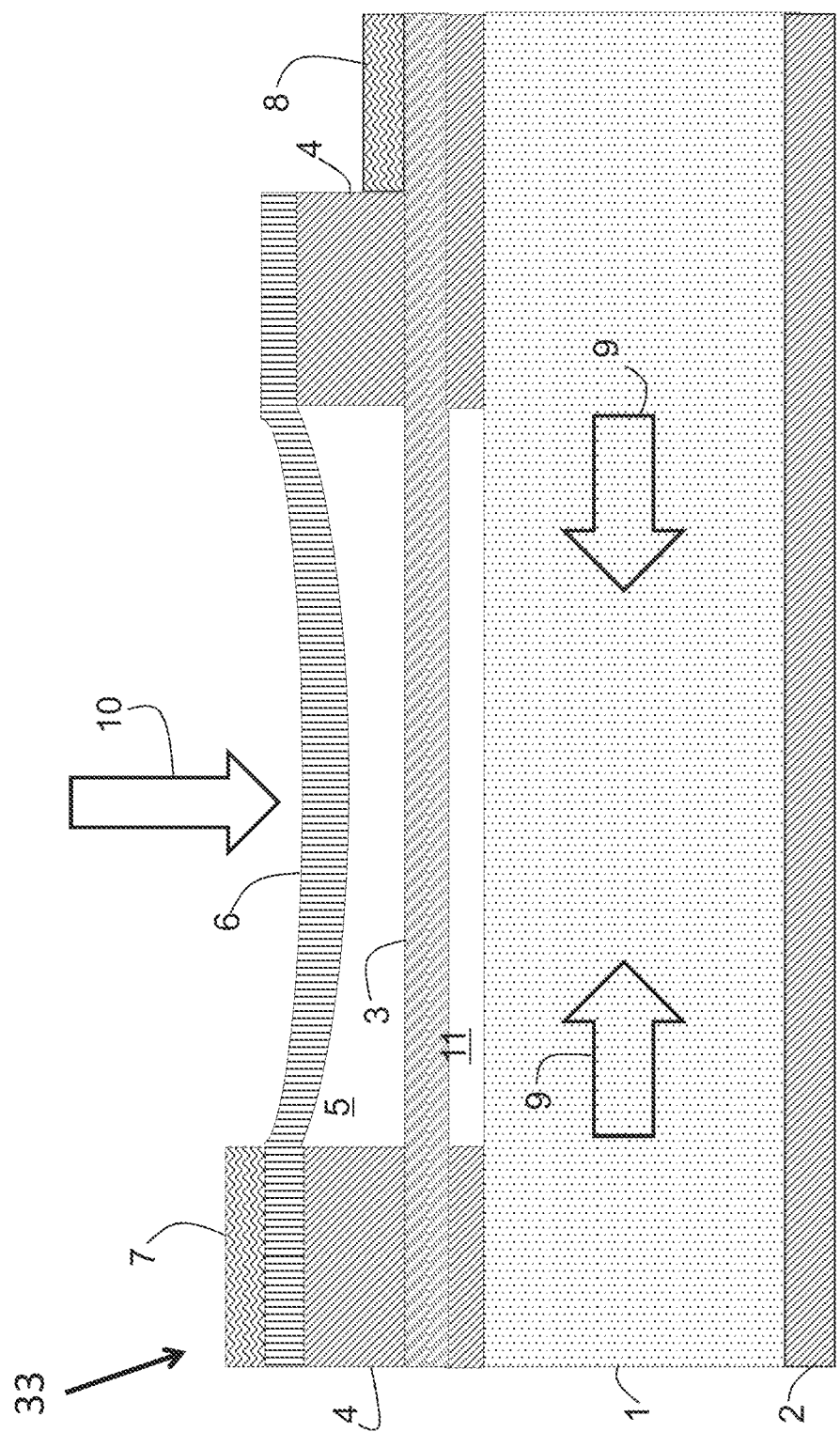
FIG. 3 shows cross section of a pressure sensor element with floating back electrode in accordance with the invention.

One aspect of the invention in accordance with FIG. 3 relates to releasing the bottom electrode 3 during the etching phase of the sensor cavity 5 e.g. in accordance with the method described in EP01982512. With this method both the top 6 and bottom electrodes 3 will be of a porous polycrystalline silicon layer or functionally equivalent material, whereby a second cavity 11 may be formed between the bottom electrode and the substrate 1, in FIG. 3 below the bottom electrode 3. Therefore the bottom electrode 3 will be encapsulated within or on the border of the cavity 5 but suspended from its edges to the supporting structure 4. Thereby the bottom electrode 3 will not be affected by the external, measureable pressure, and hence it is being inactive to the pressure measurement. In other words the bottom electrode 3 is enclosed in the same pressure as the first cavity 5 by forming a second cavity 11 between the bottom electrode 3 and the substrate 1. As well the mechanically released floating bottom electrode 3 is independent from the temperature stresses caused by different temperature coefficients in different layers and stresses caused by mounting, therefore the bottom electrode 3 is also inactive to the pressure to be measured, whereby the pressure measurement is performed by the top electrode 6 only as designed.

In accordance with the second embodiment of FIG. 4 of the invention one additional measure is to open the silicon frame 1 from the backside by deep etching. With this measure the bottom electrode 3 of the sensor structure 12 will be released until the bottom electrode 3 in order to form a pressure port 34 for the bottom electrode 3. Then, also the bottom electrode 3 will bend under the influence of the external pressure 10, whereby also the bottom electrode 3 acts as a sensing element. So, the bottom electrode 3 is opened to the same pressure as the top electrode 6 by forming a pressure port 34 from the bottom electrode 3 to the ambient space.

By designing the top 6 and bottom 3 electrodes symmetrical, either an absolute or a differential pressure sensor structure is obtained including two elements bending towards each other in the first cavity 5, depending on the pressure difference over the sensor chip and the mounting of the device. By this way the sensitivity of the pressure sensor structure 12 may be doubled in the pressure range it is designed for, when they are affected by the same external pressure 10. Releasing the bottom electrode 3 works also in the method described below for compensating for the mechanical stresses of the sensor structure. In the embodiment of FIG. 4 the material of the bottom electrode 3 has no special requirements, because the etching is made through the substrate 1.

In accordance with the third embodiment described in FIG. 5 the silicon frame of the sensor 12 is released by deep silicon etching around the electric an mechanical contact areas 32, whereby trenches 30 forming silicon strings 31 extending through the whole silicon substrate 1 can be formed by lithographically defined etching. These etched trenches 30 compensate for the mechanical stresses caused by the mechanical mounting of the sensor at contact areas 32 in each corner. The trenches 30 forming the silicon strings 31 are etched directly in the silicon substrate 1 on the backside of the sensor chip. The width and depth or shape of these trenches 30 are not critical and are limited only by the available etch aspect or etch ratio of the deep silicon etcher equipment. The etched trenches 30 need not to be etched through the whole thickness of the substrate 1 material. Two different embodiments for the silicon springs are designed and these are tested by FEM-modeling. These trenches 30 may have any shape. The desired mechanical isolation of the silicon sensor structure 12 from its mechanical contacts 32 is achieved, when the ratio between the trenches 30 and strings 31 is at least 60/40, preferably more than 80/20. In other words the mechanical contact between the mechanical contact points 32 and the sensor structure 12 is decreased by at least 60%, preferably more than 80% from the situation without the trenches 30.

In accordance with FIG. 6 a fourth embodiment of the invention includes modifying the aspect ratio (length/width) of the silicon sensor in order to compensate for the mounting stresses. The part sensitive of the pressure of the sensor structure 12 is positioned in one end S of the sensor chip 26 and electric contacts 27 to the second end. The passive silicon frame 28 between the first S and second end M is thinned by deep etching as narrow as possible such that the aspect ratio between the width 24 of the passive silicon frame 28 and the width 25 of the sensor S (24/25) is small. The effectiveness of the thinned passive silicon frame depends on the aspect ratio which should generally be smaller than 1:5. The electric conductors between the sensing element S and contacts 27 are positioned on the surface of this passive silicon part 28. The sensor chip 26 with this layout is attached to a frame from the second end M whereby the part S sensitive the pressure is in the other, first end S. The elongated, thinned part 28 between the ends eliminates the stresses caused by mounting in the sensing part S of the structure 26.

In accordance with FIGS. 7A-7C the trench 30 may be circular and may represent about 50-80% of full circle, advantageously about 60% of full circle. The height of the trenches 30 in the substrate 1 is about 70-100% of the thickness of the substrate 1, advantageously about 95% of the thickness of the substrate 1.

Figure 8A:
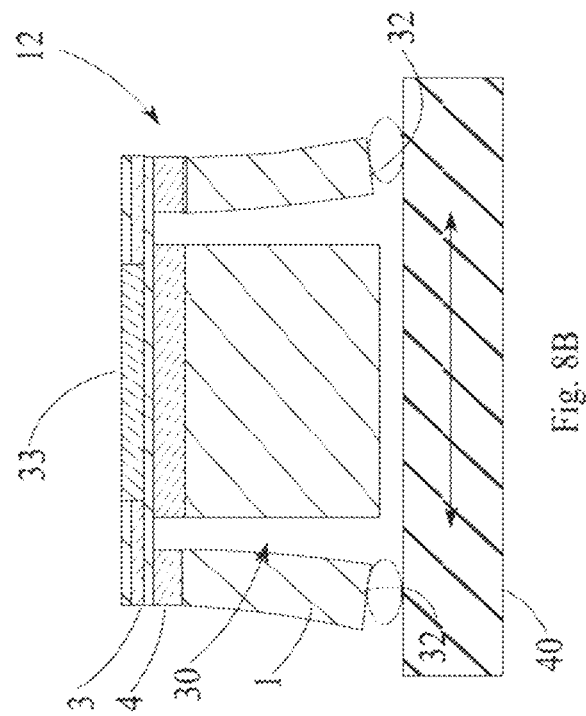
FIGS. 8A and 8B show as cross sectioned side views some embodiments of the invention.
Figure 8B:
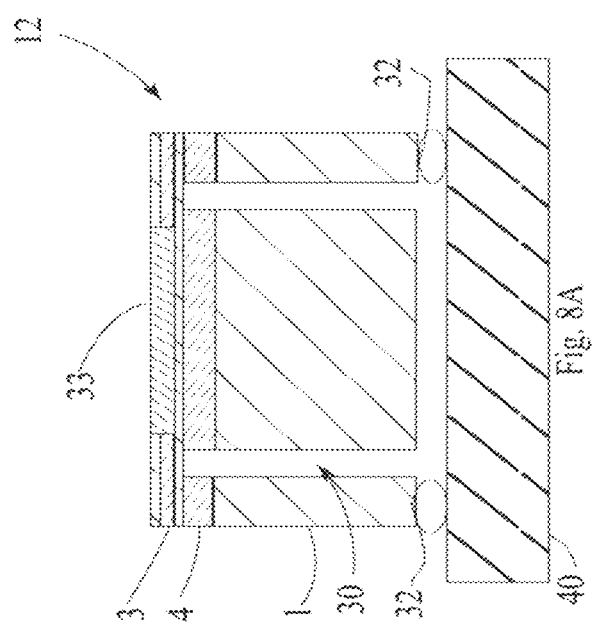

In FIGS. 8A and 8B a construction is shown, where the microelectromechanical (MEMS) component 12 may be for example: a resonator, a gyroscope, an accelerometer, a pressure sensor, an acoustic or ultrasonic microphone, a cMUT (Capacitive Micromechanical Ultrasonic Transducer), especially with TSV (Through Silicon Via), a pMUT (Pietzo Micromechanical Ultrasonic Transducer), especially with TSV (Through Silicon Via), a micromechanical mirror structure, a magnetometer, a FPI (Fabry-Perot Interferometer), a micromechanical Infrared Emitter or Absorber, a LED (Light Emitting Diode) (e.g. on GaAs epitaxial layer), an optical or RF Waveguide, an optical and RF receiver or transmitter, an Optical (IR,UV and visible light) and X-Ray Imaging Sensor, a Bioanalytical Sensor or Actuator, a Microfluidistic Sensor or Actuator, a Acoustic Emission Sensor, a Gas Sensor, a temperature and humidity sensor, a Flow Sensor, a Neutron, alpha, beta, gamma and other radiation sensor.

The micromechanical component may also be an encapsulated MEMS. In this case the encapsulation is often made of FR-4, polymer, ceramics, silicon or glass. It may be an open or hermetically closed structure.

The MEMS die may also be assembled directly on another IC-package e.g. on a read-out (ASIC) circuit which is then an essential part of the encapsulation package.

The MEMS element 12 may also be assembled directly without any special encapsulation.

The assembling platform may be a printed board or more generally any part of an electronic device including the housing of such device.

The assembling platform may also be part of a flex circuit, textile or any other flexible or elastic material.

The assembling platform any other platform, e.g. any kind of a mechanical structure involving complex functionality (robotics, hydraulics, engines etc.)

The invention is especially advantageous in components, which require long term stability. Invention is very suitable also for microphones which are sensitive for any kind of torsion due to the small gap of the structure.

In FIG. 9 is presented e.g. a pressure sensor 12, which is electrically wire bonded and glued to the substrate 40.

Figure 10:
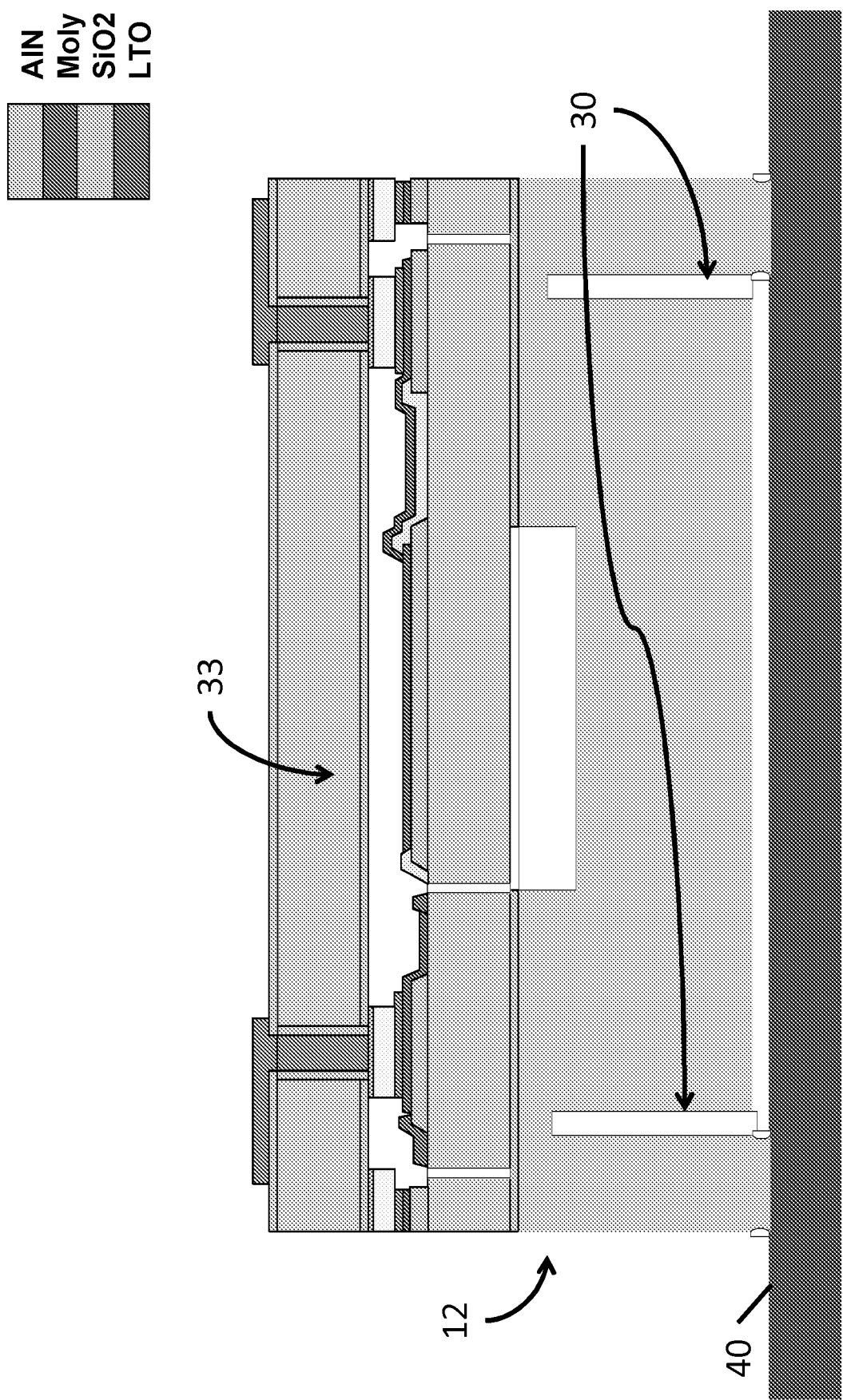
FIG. 10 shows as a cross sectioned side view a second embodiment of the invention.

In FIG. 10 the electronics is wire-bonded, and the MEMS-element 12 is glued or connected by polymer from below to the substrate 40. This structure is relevant especially for piezoelectrically (such as AlN) coupled MEMS resonators used for timing and frequency control applications and for gyroscopes. In the case the resonator has been enclosed in a low-pressure cavity by exploiting wafer-level packaging using eutectic bonding based on metal such as gold.

Figure 11:
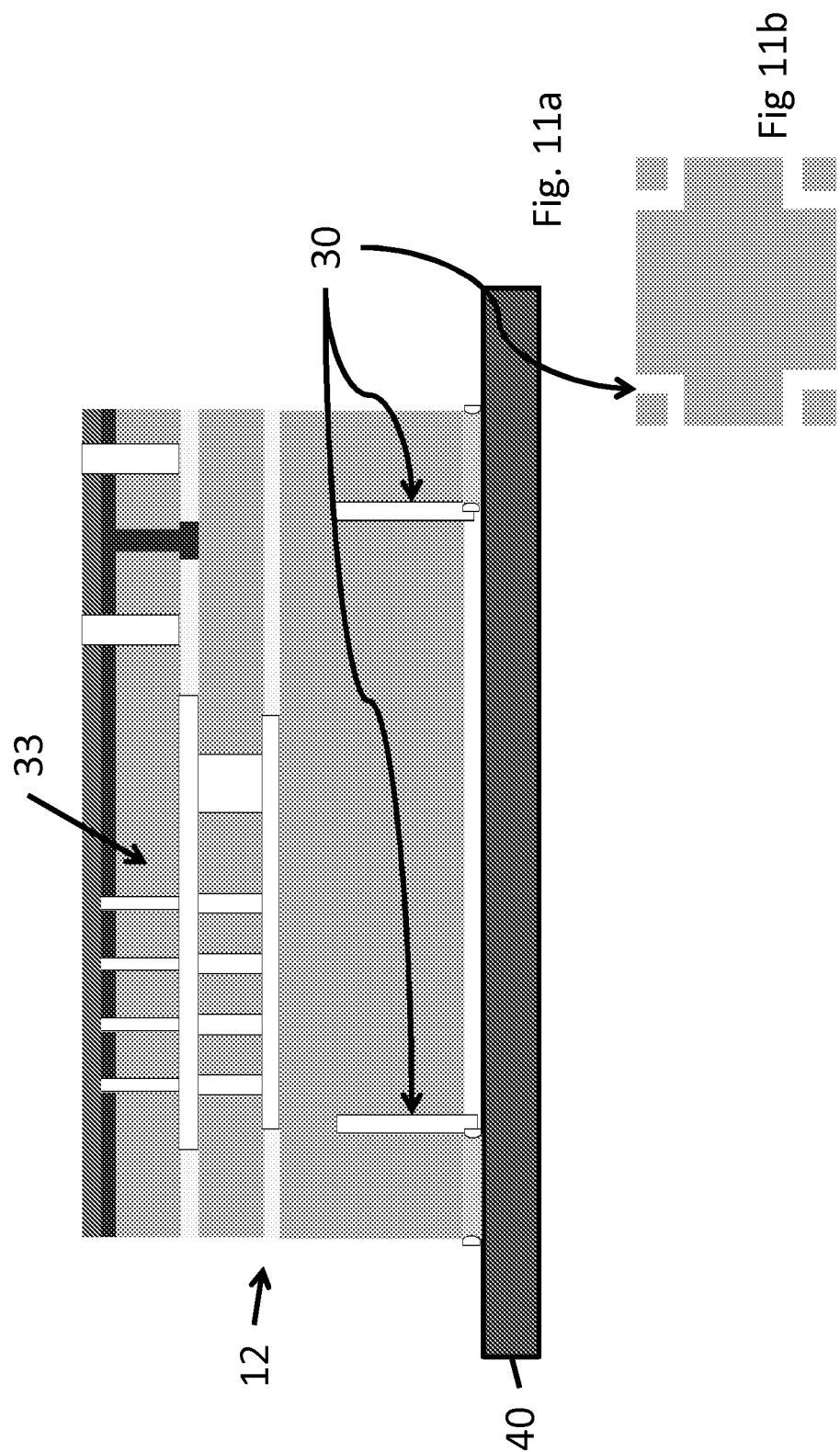
FIG. 11A shows as a cross sectioned side view a third embodiment of the invention and 11B shows a bottom view of the MEMS-element of FIG. 11A.

FIG. 11A shows as a cross sectioned side view a third embodiment of the invention and 11B shows a bottom view of the MEMS-element of FIG. 11A. Also here the MEMS-element 12 is glued or connected by polymer from below to the substrate 40. This structure is relevant for especially for gyroscopes, accelerometers, and resonators in which the movement is sensed and/or actuated based on capacitive (or electrostatic) principle. The released MEMS structure 12 has been enclosed in a controlled (low) pressure cavity by exploiting wafer-level packaging. Example of trench design is presented in FIG. 11B. The corners of the MEMS structure 12 form needle-like mechanical contact points to the substrate 40 below MEMS structure 12. Small substrate deformations in the x and y directions are relaxed by bending of the needles. Therefore, mechanical stresses are not transmitted to the released MEMS structure 12.

Figure 12:
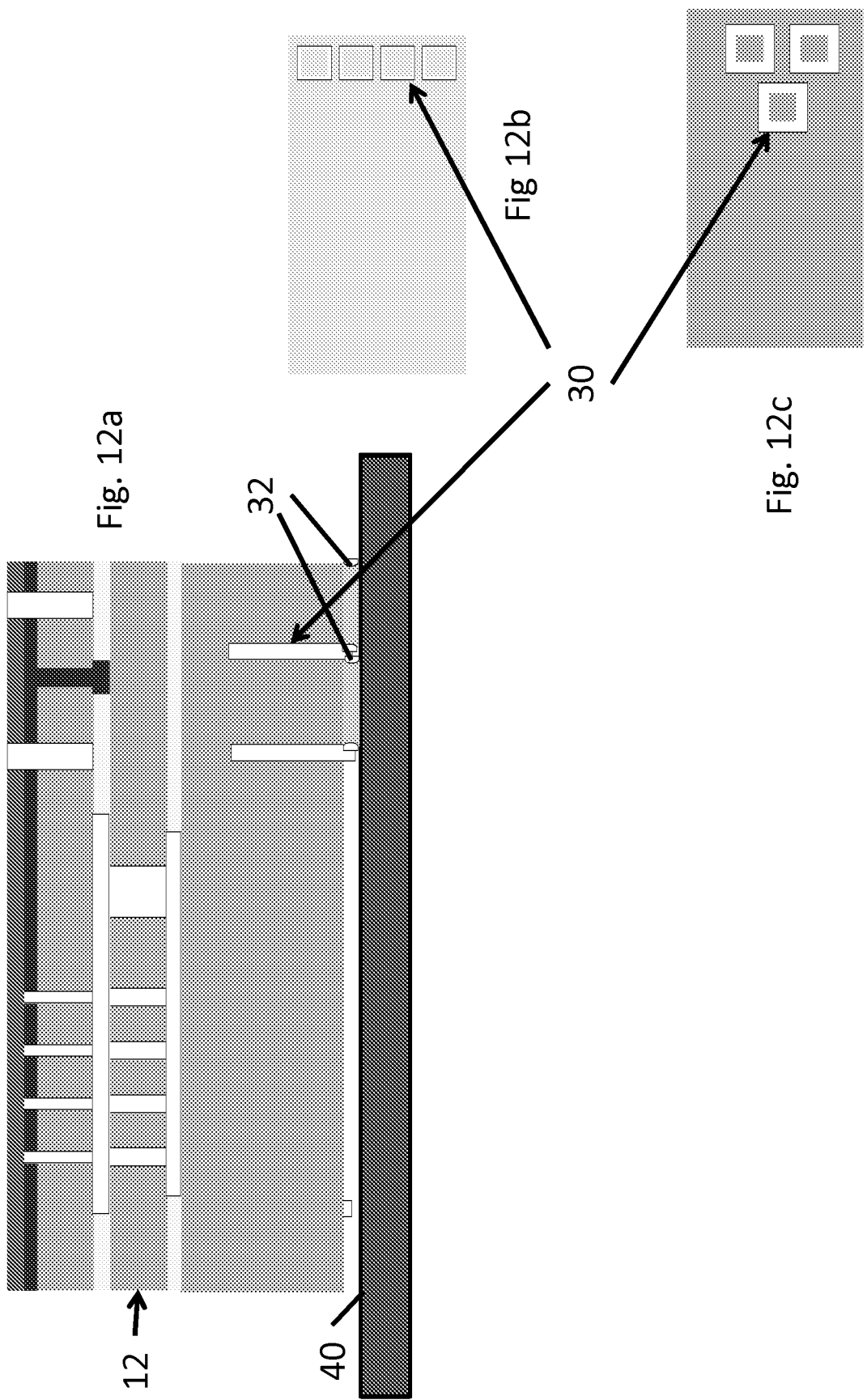
FIG. 12A shows as a cross sectioned side view a fourth embodiment of the invention and 12B and 12C shows bottom views of the MEMS-element of FIG. 12A.

FIG. 12A shows as a cross sectioned side view a fourth embodiment of the invention and 12B and 12C show bottom views of the MEMS-element of FIG. 12A. This structure is an advantageous modification of the FIG. 11. It is obvious that the mechanical contact points and wire bond sites can be moved to one side of the chip in a similar way also for structures shown in FIGS. 9 and 10. In FIG. 12A is presented an example of trench design on right side. The needle-like mechanical contact points are located only on one side of the MEMS chip. This is a preferable arrangement to avoid mechanical stresses from being transmitted to the released MEMS structure 12. Referring to FIG. 12A the contact pads are preferably on one side of the chip, the side where the mechanical contact points 32 are located. Referring to FIG. 12C needle-like mechanical contact points 32 are on one end of the chip. They should ideally be as close to each other as possible to minimize the propagation of mechanical stresses from the contact points 32 between the MEMS chip 12 and the substrate 32. On the other hand, mechanical rigidity, of the attachment, needed for example to withstand the forces exerted on the chip and its attachment to the substrate during wire bonding, require that the contact points are spread over a certain area to reduce torque forces acting on the contact points.

Figure 13:
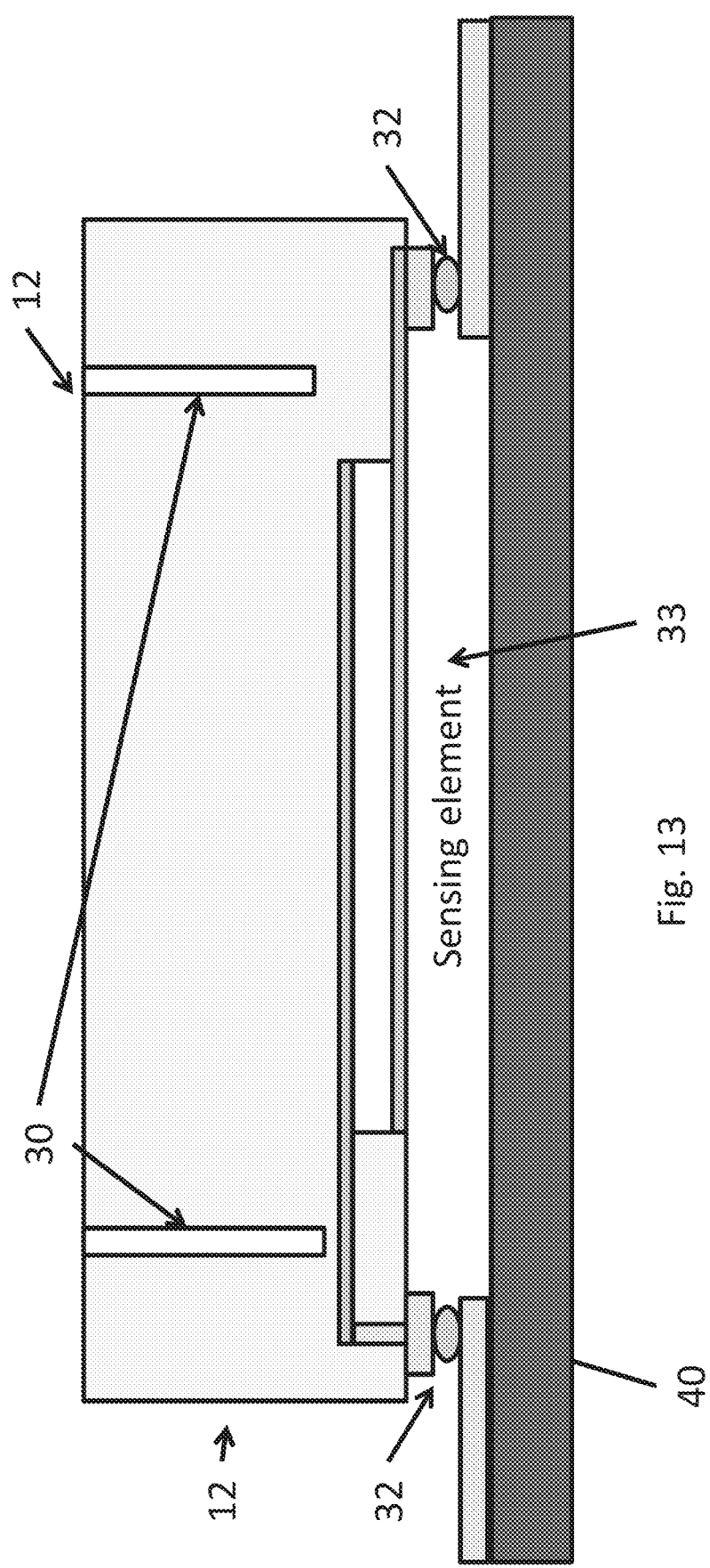
FIG. 13 shows as a cross sectioned side view fifth embodiment of the invention.

FIG. 13 shows as a cross sectioned side view fifth embodiment of the invention, flip-chip contacts below with the electrical contacts on the bottom of the MEMS-element 12 and sensing element on bottom surface. The trenches 30 are opening on backside, in figure to the top.

Figure 14:
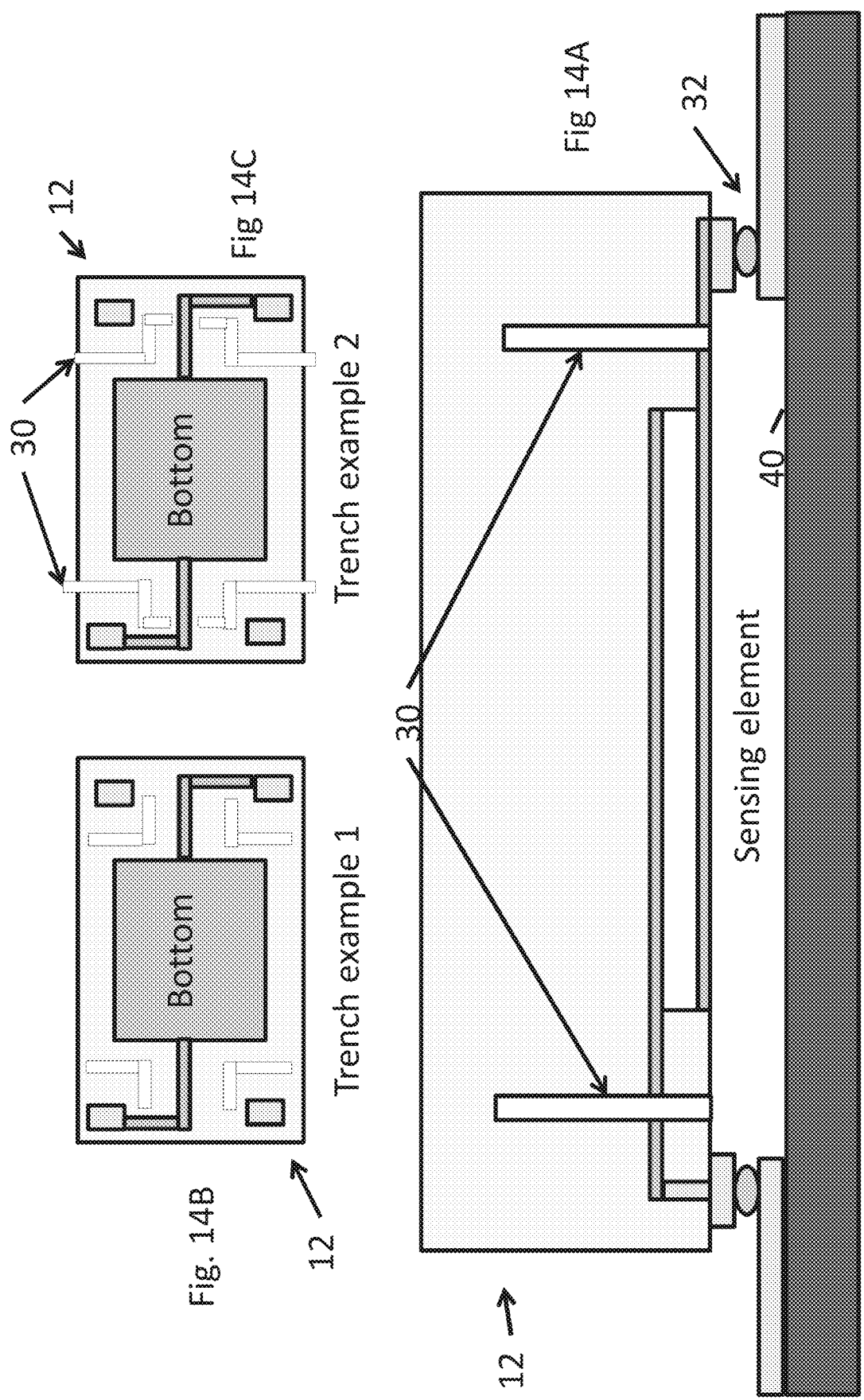
FIG. 14A shows as a cross sectioned side view a sixth embodiment of the invention and 14B and 14C shows bottom views of the MEMS-element of FIG. 14A.

FIG. 14A shows as a cross sectioned side view a sixth embodiment of the invention and 14B and 14C shows bottom views of the MEMS-element of FIG. 14A. In this embodiment the MEMS structure 12 is mechanically connected with flip-chip method to the other structure 40 like circuit board. The sensing element 33 is on the bottom surface and the trenches are opening on sensor side.

Figure 15:
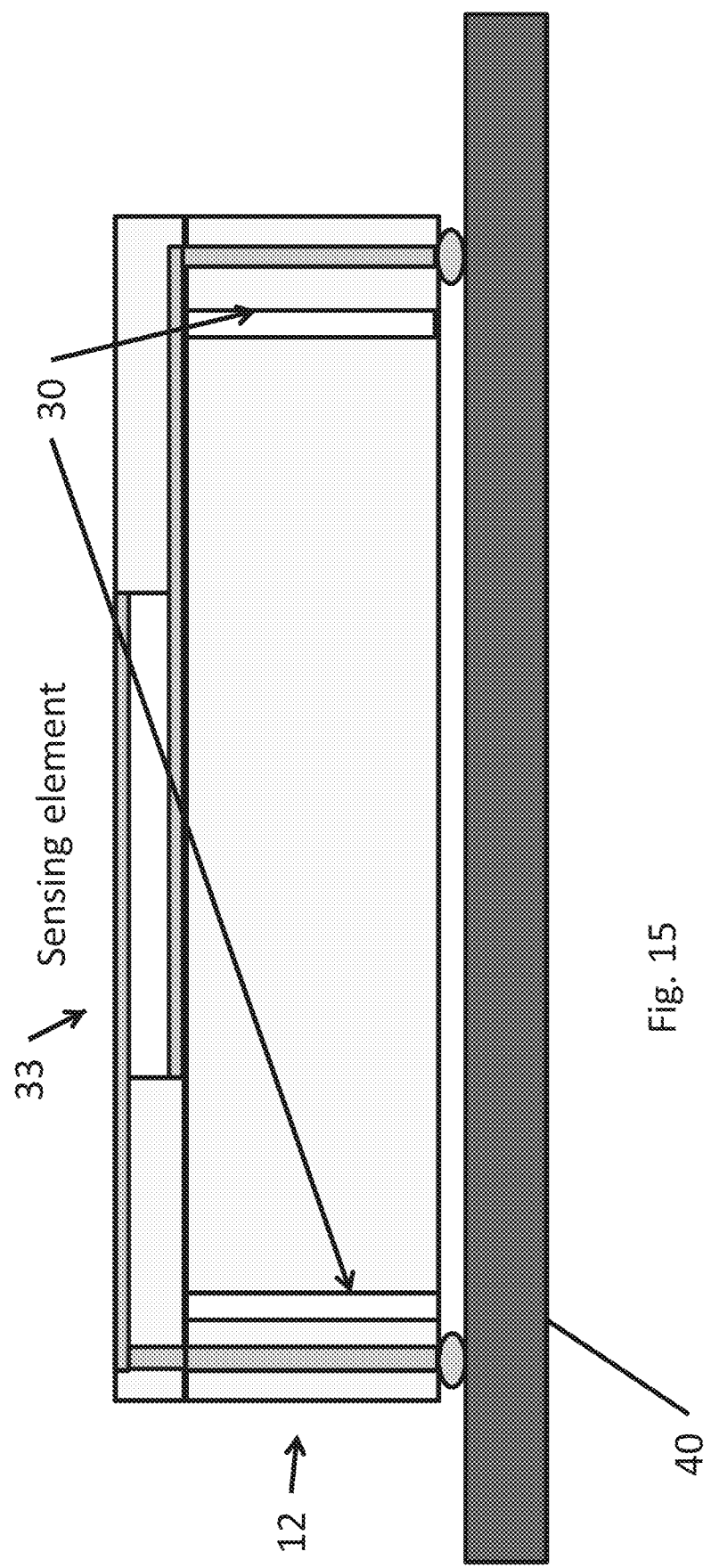
FIG. 15 shows as a cross sectioned side view a seventh embodiment of the invention.

FIG. 15 shows as a cross sectioned side view a seventh embodiment of the invention, where it includes through-silicon vias for electric contacts. The MEMS-structure 12 is flip-chip connected to the other structure 40 like circuit board from below with also electrical contacts below, and the sensing element 33 is on top of the structure. This embodiment is suitable for an ultrasound transducer, thermal IR source, pressure sensor.

Figure 16:
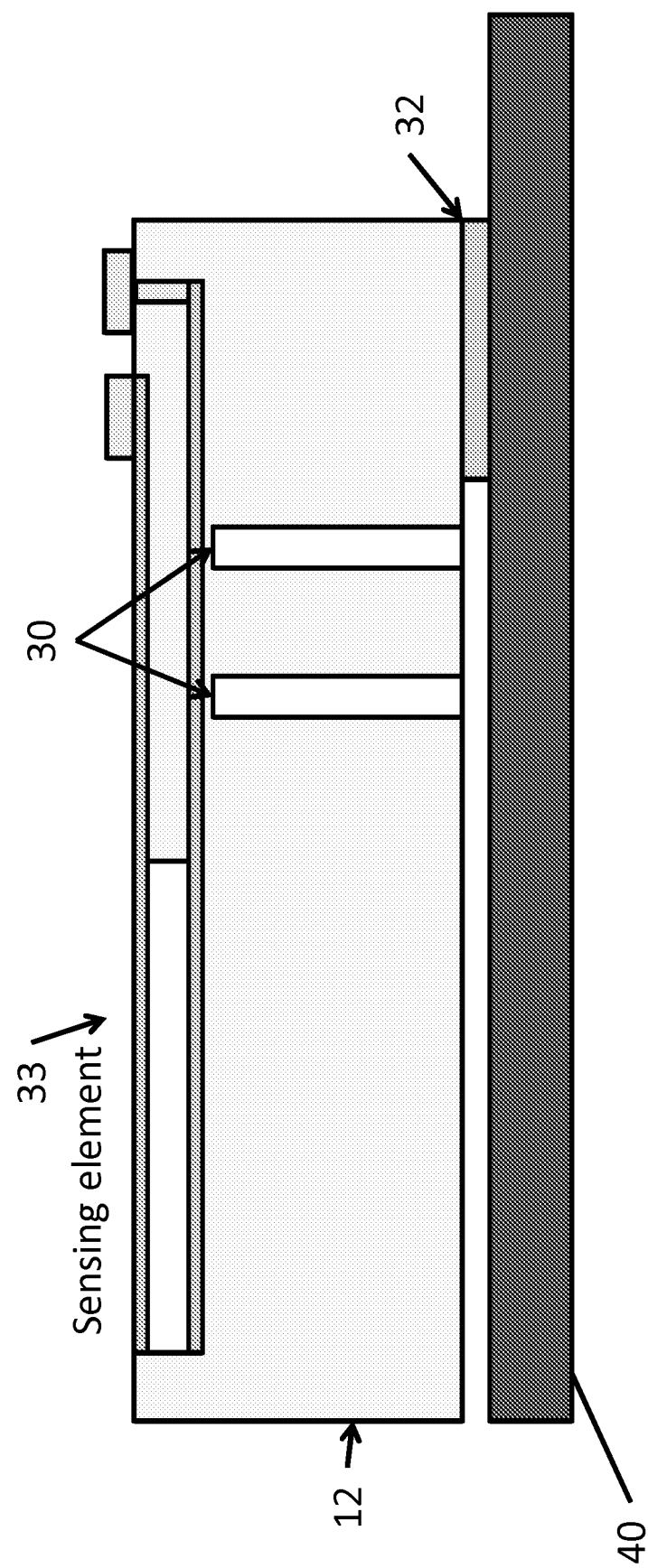
FIG. 16 shows as a cross sectioned side view an eighth embodiment of the invention.

FIG. 16 shows as a cross sectioned side view an eighth embodiment of the invention. This solution is long and narrow with electrical contacts on one side, and sensing element 33 on top. The MEMS-element 12 includes one or several trenches 30 between the mounting area 32 and the sensing element 33.

Method

The trenches 30 are typically manufactured by DRIE (Deep reactive-ion etching). Other possible manufacturing processes for the trenches 30 are (XeF2) Xenon Difluoride Etching plasma etching or any kind of wet etching, e.g. with potassium hydroxide (KOH) or TMAH (tetra-methyl-ammonium hydroxide).

As a summary the invention includes at least one of the following basic concepts:

The new innovations introduced here are
1. Floating bottom electrode 3 of a surface MEMS pressure sensor structure 12, eliminating the mechanical stress
   a) inside the MEMS chip (FIGS. 3 and 4) and
   b) between the joint of the chip and the PCB board due to the thermal mismatch (FIG. 5)

2. Bendable bottom electrode 3, either (FIG. 3) eliminating the mechanical stresses mentioned above or (FIG. 4) doubling the sensitivity of the sensor structure 12
3. Silicon string structures 31 etched directly on the substrate 1 silicon eliminating the thermal mismatch between a PCB board and the joint of the pressure sensor
4. Stick construction (FIG. 6) of the pressure sensor, eliminating the mismatches mentioned above 3.

The following paragraphs describe further embodiments of the invention:

Paragraph 1. A capacitive surface micromechanical pressure sensor structure (12) including at least one sensor element (33), each sensor element (33) comprising
- a substrate (1),
- a bottom electrode (3) in a mechanical connection with the substrate (1), and
- at least one top electrode (6) electrically isolated and spaced apart by a first cavity (5) from said bottom electrode (3), the top electrode (6) is deformable under the pressure (10) to be measured,
- the bottom electrode (3) is released (11, 34) from the substrate (1), advantageously at least essentially in the vicinity of the cavity (5).

Paragraph 2. The sensor structure (12) of Paragraph 1, characterized in that the bottom electrode (3) is concealed in the same pressure as the first cavity (5) by forming a second cavity (11) between the bottom electrode (3) and the substrate (1).

Paragraph 3. The sensor structure (12) of Paragraph 1, characterized in that the bottom electrode (3) is opened to the same pressure as the top electrode (6) by forming a pressure port (34) from the bottom electrode (3) to the ambient space.

Paragraph 4. A sensor structure (12), characterized in that it includes trenches (30) eliminating the thermal mismatch between a PCB board and mechanical joints (32) of the pressure sensor (12).

Paragraph 5. A sensor structure (12) of claim 4, characterized in that the trenches (30) are formed such that the mechanical contact between mechanical contact points (33) and the sensor structure (12) is decreased by at least 60%, preferably more than 80% from the situation without the trenches (30).

Paragraph 6. A sensor structure (12), characterized in that it is formed as an elongated chip (FIG. 6) such that the part sensitive of the pressure of the sensor structure (12) is positioned in one end (S) of the sensor chip (26) and electric contacts (27) to the second end and the sensor structure (12) is attached to a PCB board from the second (M) end whereby the part sensitive the pressure (S) is in the other, first end (S).

Paragraph 7. A method for forming a capacitive surface micromechanical pressure sensor structure (12) including at least one sensor element (33), in which method includes the following steps:
- forming a bottom electrode (3) on a substrate (1) such that it is in a mechanical connection with the substrate (1), and
- forming on this structure at least one top electrode (6) electrically isolated and spaced apart by a cavity (6) from said bottom electrode (3), which top electrode (6) is deformable under the pressure (10) to be measured,
- releasing the bottom electrode (3) from the substrate (1), advantageously at least essentially in the vicinity of the cavity (5).

Paragraph 8. The method of Paragraph 7, characterized by concealing the bottom electrode (3) in the same pressure as the first cavity (5) by forming a second cavity (11) between the bottom electrode (3) and the substrate (1) by forming the bottom electrode (3) of porous polycrystalline silicon and using this porous material (3) for etching the second cavity (11).

Paragraph 9. The method of Paragraph 7, characterized by opening that the bottom electrode (3) the same pressure as the top electrode (6) (FIG. 4) outside the cavity (5) by forming a pressure port (34) from the bottom electrode (3) to the ambient space.

Paragraph 10. A method, characterized by forming trenches (30) eliminating the thermal mismatch between a PCB board and mechanical joints (32) of the pressure sensor (12).

Paragraph 11. A method in accordance with paragraph 10, characterized in forming the trenches (30) such that the mechanical contact between mechanical contact points (33) and the sensor structure (12) is decreased by at least 60%, preferably more than 80% from the situation without the trenches (30).

Paragraph 12. A method, characterized in forming the sensor structure (12) as an elongated chip (FIG. 6) such that the part sensitive of the pressure (S) of the sensor structure (12) is positioned in one end of the sensor chip and electric contacts (27) to the second end and the sensor (12) with this layout is attached to a sensor element frame from the second end (M) whereby the part sensitive the pressure (S) is in the other, first end (S).

Paragraph 13. A micromechanical structure (12) including at least one active element (33), the micromechanical structure (12) comprising
- a substrate (1),
- at least one layer (3, 4) formed on the substrate (1) forming the at least part of the at least one active element (33),
- mechanical contact areas (32) through which the micromechanical structure (12)
- can be connected to other structures (40) like printed circuit boards and like, characterized
- in that it includes weakenings like trenches (30) around the mechanical contact areas (32) for eliminating the thermal mismatch between the active element (33) of the micromechanical structure (12) and the other structures (40).

Paragraph 13. The micromechanical structure (12) of paragraph 12, characterized in that that the weakenings are trenches (30).

Paragraph 14. The micromechanical structure (12) of paragraphs 13 or 14, characterized in that trenches are cylindrical grooves.

Paragraph 15. The micromechanical structure (12) of paragraphs 12, 13 or 14, characterized in that the weakenings extend at least 40% of the height of the micromechanical structure (12).

Paragraph 16. The micromechanical structure (12) of any previous paragraph or their combination, characterized in that the active element of the micromechanical structure (12) is a sensor structure.

Paragraph 17. The micromechanical structure (12) of any previous paragraph or their combination, characterized in that the active element of the micromechanical structure (12) is a resonator structure.

Paragraph 18. The micromechanical structure (12) of any previous paragraph or their combination, characterized in that the weakenings (30) are formed such that the mechanical contact between mechanical contact areas (32) and the micromechanical structure (12) is weakened on the opposite side of the micromechanical structure (12) to the contact areas (32) (FIG. 13).

Paragraph 19. The micromechanical structure (12) of any previous paragraph or their combination, whereby micromechanical structure (12) is a capacitive surface micromechanical pressure sensor structure (12) including at least one sensor element as an active element (33), micromechanical structure (12) comprising
- a substrate (1),
- a bottom electrode (3) in a mechanical connection with the substrate (1), and
- at least one top electrode (6) electrically isolated and spaced apart by a first cavity (5) from said bottom electrode (3), the top electrode (6) is deformable under the pressure (10) to be measured, characterized by
- the bottom electrode (3) is released (11, 34) from the substrate (1), advantageously at least essentially in the vicinity of the cavity (5).

Paragraph 20. The micromechanical structure (12) of any previous paragraph or their combination, characterized in that the bottom electrode (3) is concealed in the same pressure as the first cavity (5) by forming a second cavity (11) between the bottom electrode (3) and the substrate (1).

Paragraph 21. The micromechanical structure (12) of any previous paragraph or their combination, characterized in that the bottom electrode (3) is opened to the same pressure as the top electrode (6) by forming a pressure port (34) from the bottom electrode (3) to the ambient space.

Paragraph 22. The micromechanical structure (12) of any previous paragraph or their combination, characterized in that it is formed as an elongated chip (FIG. 6) such that the part sensitive of the pressure of the micromechanical structure (12) is positioned in one end (S) of the sensor chip (26) and electric contacts (27) to the second end and the sensor structure (12) is attached to a PCB board from the second (M) end whereby the part sensitive the pressure (S) is in the other, first end (S).

Paragraph 23. A method for forming a micromechanical structure (12) including at least one active element (33), the micromechanical structure (12) comprising
- a substrate (1),
- at least one layer (3, 4) formed on the substrate (1) forming the at least part of the at least one active element (33),
- mechanical contact areas (32) through which the micromechanical structure (12) can be connected to other structures (40) like printed circuit boards and like, characterized
- in forming weakenings to the micromechanical structure (12) like trenches (30) around the mechanical contact areas (32) for eliminating the thermal mismatch between the active element (33) of the micromechanical structure (12) and the other structures (40).

Paragraph 24. The method of paragraph 23, characterized in that the weakenings are made by DRIE (Deep reactive-ion etching).

Paragraph 25. The method of paragraph 23, characterized in that the weakenings are made by (XeF2) Xenon Difluoride Etching plasma etching or any kind of wet etching, e.g. with potassium hydroxide (KOH) or TMAH (tetra-methyl-ammonium hydroxide).

Paragraph 26. The method of any previous method paragraphs, characterized in that the method includes the following steps:
- forming a bottom electrode (3) on a substrate (1) such that it is in a mechanical connection with the substrate (1), and
- forming on this structure at least one top electrode (6) electrically isolated and spaced apart by a cavity (6) from said bottom electrode (3), which top electrode (6) is deformable under the pressure (10) to be measured, characterized in that
- releasing the bottom electrode (3) from the substrate (1).

Paragraph 27. A method in accordance with any previous method paragraph, characterized by concealing the bottom electrode (3) in the same pressure as the first cavity (5) by forming a second cavity (11) between the bottom electrode (3) and the substrate (1) by forming the bottom electrode (3) of porous polycrystalline silicon and using this porous material (3) for etching the second cavity (11).

Paragraph 28. The method in accordance with any previous method paragraph, characterized by opening that the bottom electrode (3) the same pressure as the top electrode (6) (FIG. 4) outside the cavity (5) by forming a pressure port (34) from the bottom electrode (3) to the ambient space.

Paragraph 29. The method of any previous method paragraph, characterized by forming trenches (30) eliminating the thermal mismatch between a PCB board and mechanical joints (32) of the pressure sensor (12).

Paragraph 30. The method of paragraph 28, characterized in forming the trenches (30) such that the mechanical contact between mechanical contact points (33) and the sensor structure (12) is decreased by at least 60%, preferably more than 80% from the situation without the trenches (30).

Paragraph 31. The method in accordance with any previous method paragraph, characterized in forming the sensor structure (12) as an elongated chip (FIG. 6) such that the part sensitive of the pressure (S) of the sensor structure (12) is positioned in one end of the sensor chip and electric contacts (27) to the second end and the sensor (12) with this layout is attached to a sensor element frame from the second end (M) whereby the part sensitive the pressure (S) is in the other, first end (S).

Definitions

In the present context, the term weakening means trenches or any other type of mechanical structure causing weakening in the micromechanical element.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to one embodiment or an embodiment means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment. Where reference is made to a numerical value using a term such as, for example, about or substantially, the exact numerical value is also disclosed.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In this description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The verbs "to comprise" and "to include" are used in this document as open limitations that neither exclude nor require the existence of also un-recited features. The features recited in depending claims are mutually freely combinable unless otherwise explicitly stated. Furthermore, it is to be understood that the use of "a" or "an", that is, a singular form, throughout this document does not exclude a plurality.

INDUSTRIAL APPLICABILITY

At least some embodiments of the present invention find industrial application in semiconductor industry.

ACRONYMS LIST

| | |
|---|---|
| MEMS | Microelectromechanical systems |
| Flip chip | controlled collapse chip connection |
| DRIE | Deep reactive-ion etching |

The invention claimed is:

1. A micromechanical structure including at least one active element, the micromechanical structure comprising:
   a substrate,
   at least one layer formed on the substrate forming at least part of the at least one active element,
   mechanical contact areas through which the micromechanical structure is connectable to other structures, and
   trench weakenings included around the mechanical contact areas for eliminating thermal mismatch between the at least one active element of the micromechanical structure and the other structures,
   wherein the micromechanical structure is a capacitive surface micromechanical pressure sensor structure including at least one sensor element as an active element among the at least one active element, and wherein the micromechanical structure further comprises:
   a bottom electrode in a mechanical connection with the substrate, and
   at least one top electrode electrically isolated and spaced apart by a first cavity from said bottom electrode, the top electrode is deformable under a pressure to be measured, and
   wherein the bottom electrode is released from the substrate, advantageously at least essentially in the vicinity of the cavity.

2. The micromechanical structure of claim 1, wherein the trench weakenings are cylindrical grooves.

3. The micromechanical structure of claim 2, wherein the trench weakenings extend at least 40% of the height of the micromechanical structure.

4. The micromechanical structure of claim 1, wherein the at least one active element of the micromechanical structure comprises a sensor structure.

5. The micromechanical structure of claim 1, wherein the at least one active element of the micromechanical structure comprises a resonator structure.

6. The micromechanical structure of claim 1, wherein the trench weakenings are formed such that a mechanical contact between mechanical contact areas and the micromechanical structure is weakened on the opposite side of the micromechanical structure to the mechanical contact areas.

7. The micromechanical structure of claim 1, wherein the bottom electrode is concealed in the same pressure as the first cavity by forming a second cavity between the bottom electrode and the substrate.

8. The micromechanical structure of claim 1, wherein the bottom electrode is opened to the same pressure as the top electrode by forming a pressure port from the bottom electrode to the ambient space.

9. The micromechanical structure of claim 1, formed as an elongated chip such that a part sensitive to the pressure of the micromechanical structure is positioned in a first end of the elongated chip and electric contacts to a second end and the sensor structure is attached to a PCB board from the second end whereby the part sensitive to the pressure is in the first end.

10. A method for forming a micromechanical structure including at least one active element comprising:
   a substrate,
   at least one layer formed on the substrate forming the at least part of the at least one active element,
   mechanical contact areas through which the micromechanical structure are connectable to other structures, and
   trench weakenings formed to the micromechanical structure around the mechanical contact areas for eliminating the thermal mismatch between the active element of the micromechanical structure and the other structures,
   wherein the micromechanical structure is a capacitive surface micromechanical pressure sensor structure including at least one sensor element as an active element among the at least one active element, and wherein the micromechanical structure further comprises:
   a bottom electrode in a mechanical connection with the substrate, and at least one top electrode electrically isolated and spaced apart by a first cavity from said bottom electrode, the top electrode is deformable under a pressure to be measured, wherein the bottom electrode is released from the substrate, advantageously at least essentially in the vicinity of the cavity.

11. The method of claim 10, wherein the trench weakenings are made by DRIE (Deep reactive-ion etching).

12. The method of claim 10, wherein the method comprises the following steps:

forming a bottom electrode on the substrate such that it is in a mechanical connection with the substrate, forming on this structure at least one top electrode electrically isolated and spaced apart by a cavity from said bottom electrode, which top electrode is deformable under a pressure to be measured, and releasing the bottom electrode from the substrate.

* * * * *